(12) United States Patent
English (10) Patent No.: US 7,893,349 B2
(45) Date of Patent: Feb. 22, 2011

(54) PHOTOVOLTAIC MULTI-JUNCTION WAVELENGTH COMPENSATION SYSTEM AND METHOD

(75) Inventor: Peter English, Aliso Viejo, CA (US)

(73) Assignee: Suncore, Inc., Irvine, CA (US)

(*) Notice: Subject to any disclaimer, the term of this patent is extended or adjusted under 35 U.S.C. 154(b) by 0 days.

(21) Appl. No.: 12/389,307

(22) Filed: Feb. 19, 2009

(65) Prior Publication Data
US 2010/0206366 A1   Aug. 19, 2010

(51) Int. Cl.
  *H01L 31/00* (2006.01)
(52) U.S. Cl. ....................... 136/255; 307/86
(58) Field of Classification Search .............. None
  See application file for complete search history.

(56) References Cited
U.S. PATENT DOCUMENTS

2003/0159728 A1*  8/2003  Berry ................ 136/256
2008/0245406 A1* 10/2008  Yamazaki et al. ........ 136/252
2009/0020149 A1*  1/2009  Woods et al. ............ 136/244

* cited by examiner

*Primary Examiner*—Jennifer K Michener
*Assistant Examiner*—Magali P Slawski
(74) *Attorney, Agent, or Firm*—Knobbe Martens Olson & Bear LLP (57) ABSTRACT

Systems and methods are disclosed for current loss compensation in multi-junction photovoltaic cells. The use of direct electrical contact with the interconnect layers in a multi-junction PV cell can improve cell efficiency over variable lighting conditions. Electrical contact with some or all of the interconnect layers can advantageously permit disconnection of subcells operating at low current or voltage. The result is multi-junction PV cells that can adapt to variable lighting conditions and compensate for a decrease in current in certain subcells, thereby advantageously improving a multi-junction PV cell's total output current.

7 Claims, 5 Drawing Sheets

PHOTOVOLTAIC MULTI-JUNCTION WAVELENGTH COMPENSATION SYSTEM AND METHOD

BACKGROUND

1. Field

This disclosure relates generally to photovoltaic (PV) cells and, more specifically, to multi-junction PV cells.

2. Description of the Related Art

PV cells absorb energy from electromagnetic waves and convert the absorbed photon energy into electrical energy. An important use of PV cells is converting solar energy into electricity. There are two broad classes of structures used in PV cells: single-junction and multi-junction cells.

A single-junction PV cell comprises a single subcell having a characteristic band gap. The subcell typically comprises one or more semiconductor materials having two oppositely doped regions, a base region and an emitter region, contacting at the junction. The subcell is exposed to a source of electromagnetic radiation. When the energy of an incident photon is within or greater than the subcell's characteristic band gap, the photon can be absorbed by the subcell to create an electron-hole pair. The electrons and holes are then driven by the internal electric field in the subcell to produce a current.

Single-junction PV cell efficiency is limited due to the single subcell's inability to efficiently convert the broad range of energy within the electromagnetic spectrum. Photons with energy below the subcell's band gap are lost, because they pass through the subcell without being absorbed. Photons with energy above the subcell's band gap are also lost. The energy necessary to generate the hole-electron pair is absorbed, but the remaining energy is converted into heat.

Multi-junction PV cells are a type of PV cell developed for improved efficiency over single-junction PV cells. By incorporating different semiconductor cell materials, the band gap of each subcell in a multi-junction PV cell can be selected to absorb a specific range of photon energies. Multi-junction PV cells are so-called because the cells comprise multiple subcells, each subcell having at least one junction between a p-type doped region and an n-type doped region.

The subcells in a multi-junction PV cell are typically stacked so that electromagnetic radiation falls first on the subcell having the highest band gap. Photons not absorbed by the first subcell are transmitted to the second subcell, which then absorbs the higher-energy portion of the remaining photons while remaining transparent to the lower-energy photons. Photons below the band gap of the second subcell pass through to the lower subcells to be absorbed there. These selective absorption processes continue through to the final subcell, which has the smallest band gap.

In commercialized multi-junction PV cells, the subcells are electrically connected in series through interconnect layers, and the composite PV cell has two terminals, a front contact and a back contact. Because of the series connection, the subcell with the lowest current limits the overall current of the cell. Consequently, if the maximum current of each subcell is not the same, then cell efficiency suffers. To improve cell efficiency, cell designers adjust the subcells' thicknesses to ensure each subcell is generating the same current.

It is difficult to have each subcell operate at the same current, and thus maximum efficiency, if the multi-junction PV cell is to be used in variable lighting conditions. For example, a cell designer can adjust subcell thickness to ensure each subcell generates the same current in full, direct sunlight. However, the electromagnetic spectrum for full, direct sunlight is different than the electromagnetic spectrum for partial sunlight and for indirect sunlight. If the PV cell is operating on a cloudy day, the number of low-energy photons in the electromagnetic spectrum will be reduced, leading to fewer photons being absorbed by one or more of the subcells. Consequently, on a cloudy day, each subcell will not generate the same current. The overall cell current will be lowered due to the current-limiting lower-most subcells.

Thus, a problem remains in maintaining cell efficiency in multi-junction PV cells over variable lighting conditions.

SUMMARY

The use of direct electrical contact with the interconnect layers in a multi-junction PV cell can improve cell efficiency over variable lighting conditions. Electrical contact with some or all of the interconnect layers can advantageously permit disconnection of subcells operating at low current or voltage. The result is multi-junction PV cells that can adapt to variable lighting conditions and compensate for a decrease in current in certain subcells, thereby advantageously improving a multi-junction PV cell's total output current.

In at least one embodiment, an assembly for a photovoltaic cell is provided. The assembly can comprise a plurality of subcells configured in a stack, the plurality of subcells comprising a top subcell having an outward-facing surface. The assembly can further comprise an electrically conductive interconnect layer disposed between at least two of the subcells in the plurality of subcells. The assembly can further comprise at least one via between the interconnect layer and the outward-facing surface of the top subcell, wherein the interconnect layer permits an electrical connection between at least one subcell and the via.

In certain embodiments, the interconnect layer can comprise a tunnel junction. For example, the interconnect layer can comprise a tunnel diode. An interconnect layer can be disposed between each of the plurality of subcells.

The plurality of subcells can comprise at least three subcells. For example, the plurality of subcells can comprise at least six subcells. Any plural number of subcells is appropriate for use in an assembly, however.

The assembly can further comprise a dielectric layer disposed on the periphery of the at least one via, configured to insulate the via from one or more subcells. The dielectric layer can comprise silicon dioxide. However, other high-K or low-K dielectrics are appropriate for use herein.

In some embodiments, the assembly further comprises an electrically conductive fill layer disposed within the at least one via. The conductive fill layer can comprise a metal.

In at least one embodiment, a multi-junction photovoltaic cell comprising a plurality of subcells is provided. The plurality of subcells can comprise a front subcell having an outward-facing surface, a back subcell, and one or more middle subcells. For example, the plurality of subcells can comprise one middle subcell or four middle subcells. However, any number of subcells is appropriate for use herein. The one or more middle subcells can be configured in a stack between the front subcell and the back subcell.

The cell can further comprise an output terminal in communication with the front subcell and an output terminal in communication with the back subcell. The output terminals can be configured to receive an electrical load.

The cell can further comprise an interconnect layer disposed between each of the subcells in the plurality of subcells. For each of the interconnect layers, a plurality of vias configured to provide electrical communication between the outward-facing surface of the front subcell and the interconnect layer can be provided. The plurality of vias can be substantially centered along the conductive connector.

A conductive connector contacting the plurality of vias and configured to provide electrical communication between the interconnect layer and a microprocessor configured to measure the current or voltage from the interconnect layer can further be provided for each interconnect layer. The conductive connector can comprise a metal. The conductive connector for each of the interconnect layers can be configured in a comb-shaped pattern, and the plurality of vias can be spaced along the conductive connector. In some embodiments, the cell can further comprise, for each conductive connector, a solid state switch in electrical communication with the conductive connector. The conductive connector can be configured to bypass a subcell adjacent the interconnect layer in communication with the conductive connector based upon the measured current or voltage from the interconnect layer.

In at least one embodiment, a method of compensating for loss of current in a multi-junction photovoltaic cell comprising a plurality of subcells is provided. The method can comprise sequentially evaluating a current or voltage for each subcell in the plurality of subcells and electrically bypassing one or more subcells in the plurality of subcells that generate a current or voltage below a threshold value.

Evaluating can comprise electrically bypassing all but one of the subcells in the plurality of subcells, measuring the current or voltage generated by the subcell that is not bypassed, and determining whether the current or voltage generated by the subcell that is not bypassed is below a threshold value.

The method can further comprise comprising operating the photovoltaic cell for a preprogrammed time period prior to testing each subcell in the plurality of subcells. The method can also comprise operating the photovoltaic cell for a preprogrammed time period after bypassing the one or more subcells that were evaluated as generating a current or voltage below the threshold value.

For purposes of summarizing the embodiments and the advantages achieved over the prior art, certain items and advantages are described herein. Of course, it is to be understood that not necessarily all such items or advantages may be achieved in accordance with any particular embodiment. Thus, for example, those skilled in the art will recognize that the inventions may be embodied or carried out in a manner that achieves or optimizes one advantage or group of advantages as taught or suggested herein without necessarily achieving other advantages as may be taught or suggested herein.

BRIEF DESCRIPTION OF THE DRAWINGS

A general architecture that implements the various features of the disclosed systems and methods will now be described with reference to the drawings. The drawings and the associated descriptions are provided to illustrate embodiments and not to limit the scope of the disclosure.

Throughout the drawings, reference numbers are re-used to indicate correspondence between referenced elements. In addition; the first digit of each reference number indicates the figure in which the element first appears.

DETAILED DESCRIPTION

Various embodiments include the realization that the use of direct electrical contact with the interconnect layers in a PV cell can improve cell efficiency over variable lighting conditions. Electrical contact with each interconnect layer can advantageously permit disconnection of subcells operating at low current or voltage. The result is multi-junction PV cells that can adapt to variable lighting conditions and compensate for a decrease in current in certain subcells, thereby advantageously improving the PV cell's total output current.

Figure 1:
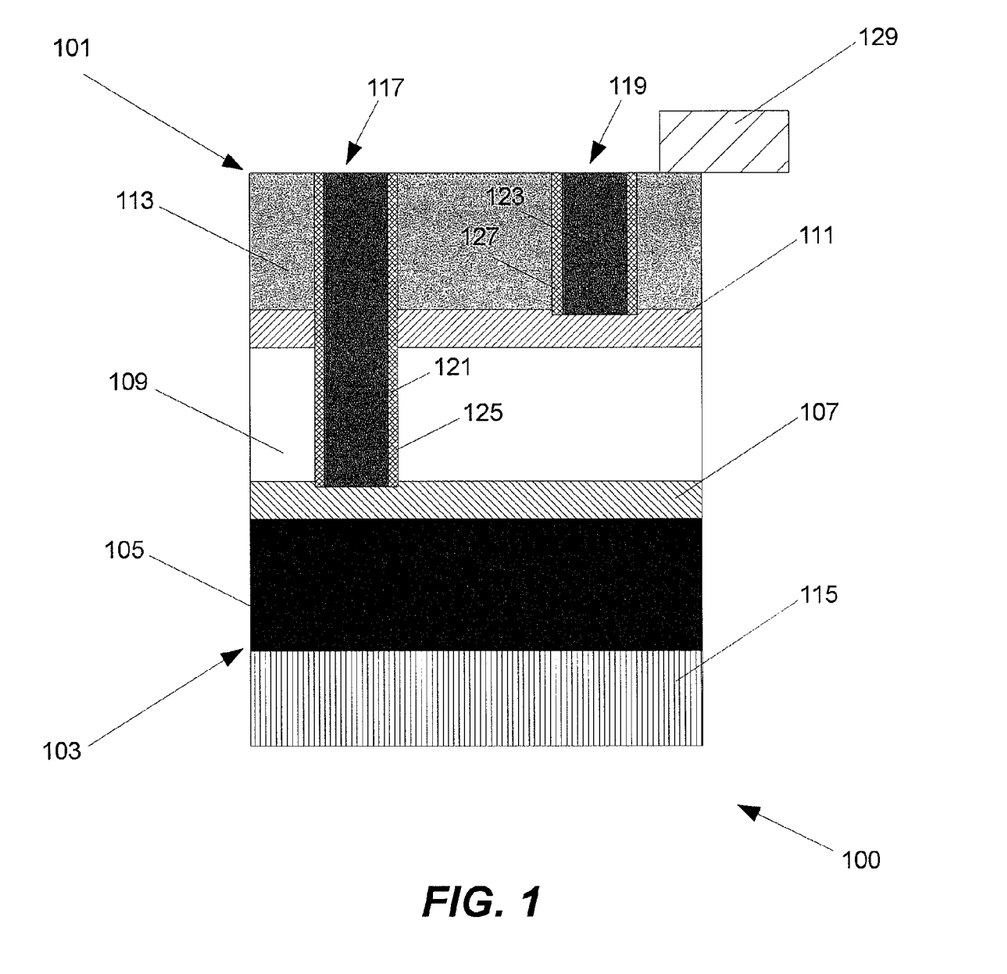
FIG. 1 is a schematic cross-sectional view of an assembly for a multi-junction PV cell.

For a more detailed understanding of the disclosure, reference is first made to FIG. 1, which illustrates a schematic cross-sectional view of an assembly 100 for a multi-junction PV cell. In general, an assembly comprises a plurality of subcells configured in a stack. An interconnect layer is disposed between at least two of the plurality of subcells. Vias are used to provide communication between interconnect layers and an assembly surface.

The example assembly 100 comprises two outward-facing surfaces, a light-facing surface 101 and a substrate-facing surface 103. The example assembly 100 comprises three subcells, designated in this example as bottom subcell 105 (comprising substrate-facing surface 103), middle subcell 109, and top subcell 113 (comprising light-facing surface 103). The subcells are configured in a stack and disposed on an optional substrate 115. A first interconnect layer 107 is disposed between bottom subcell 105 and middle subcell 109. A second interconnect layer 111 is disposed between the middle subcell 109 and top subcell 113.

The substrate 115 can be provided to support the stack of subcells 105, 109, 113. A wide variety of suitable substrate materials are known in the art and include glass, polymers, metal foil, semiconductor materials, e.g., Ge or GaAs wafers, and combinations thereof. A substrate can optionally include additional layers such as an ohmic contact between the stack and the substrate, anti-reflective coating layer, and the like, as are known in the art.

As used herein, a subcell (represented in FIG. 1 as bottom subcell 105, middle subcell 109, and top subcell 113) is a layer that produces a current output when exposed to certain wavelengths of the electromagnetic spectrum. A subcell comprises an oppositely doped base region and emitter region and a p-n or n-p junction between the regions. An assembly can comprise two, and more preferably, three, four, five, six, or more subcells.

Various subcell configurations are suitable for use in the disclosed embodiments. The p-n or n-p junction can be a homojunction. A homojunction is a junction between a p-type doped region and an n-type doped region, wherein the same semiconductor material having the same characteristic band gap is found on both sides of the junction. The p-n or n-p junction can be a heterojunction. A heterojunction is a junction between a p-type doped region and an n-type doped region, wherein different semiconductor materials having different characteristic band gaps are found on both sides of the junction. In certain embodiments, a subcell further comprises a front and/or back window, back surface field (BSF), buffer/nucleation layer, or other regions as are known in the art.

Figure 2A:
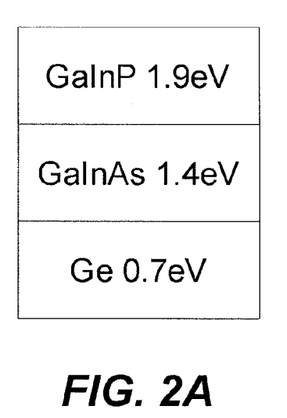
FIG. 2A depicts an assembly comprising three subcells.
Figure 2B:
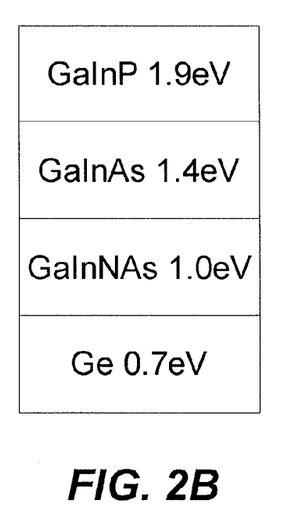
FIG. 2B depicts an assembly comprising four subcells.
Figure 2C:
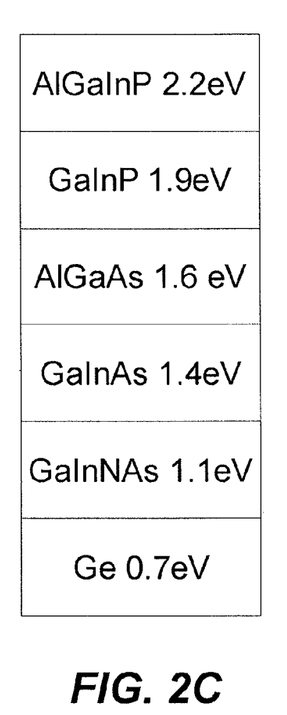
FIG. 2C depicts an assembly comprising six subcells.

A variety of semiconductor materials are suitable for use in subcells. In certain embodiments, a subcell comprises one or more of C, Si, S, Ge, In, Ga, Al, N, P, Se, and As. For example, suitable semiconductor materials include, but are not limited to, Si (crystalline and amorphous), carbon (e.g., diamond and diamond-like amorphous carbon), InP, InGaAsP, SiGe, GaAs, AlInP$_2$, GaInP$_2$, AlGaAs, CIS (copper indium selenide), CGS (copper gallium selenide), CIGS (copper indium gallium selenide), and CIGSS (copper indium gallium sulfur selenide). As explained above, the semiconductor materials preferably can be selected to absorb a specific range of photon energies over the entire light spectrum. Example subcell configurations with suitable semiconductor materials (along with their characteristic band gap energies) for three-, four-, and six-subcell configurations are shown in FIG. 2A, FIG. 2B, and FIG. 2C, respectively. Other configurations, of course, are suitable for use in the embodiments disclosed herein.

An interconnect layer (represented in FIG. 1 as first interconnect layer 107 and second interconnect layer 111) can be configured to aid the flow of electrons between two subcells. In certain embodiments, the interconnect layer comprises an ohmic interconnect, that is, an interconnect configured to aid the flow of current. The interconnect layer can permit current to pass between two subcells, without generating a large voltage drop. Preferably, the interconnect layer is thin and is characterized by a low resistivity. An example of a suitable ohmic interconnect is a tunnel junction. Suitable tunnel junctions include tunnel transistors and tunnel diodes. A tunnel junction can include one or more optional BSF layers, as is known in the art. In preferred embodiments, the interconnect layer includes a tunnel diode comprising one or more oppositely doped semiconductor materials. The semiconductor material can be selected to be non-absorbing to light energy intended for lower subcells. Suitable interconnect layer materials are known in the art and include, but are not limited to, GaAs, InGaP, InGaAs, AlGaAs, etc. An interconnect layer need not be provided between each subcell.

Vias are holes configured to provide communication between interconnect layers and an assembly surface. Referring again to FIG. 1, the example assembly 100 comprises two vias (a first via 117 and a second via 119). The first via 117 provides communication between the first interconnect 107 and the light-facing surface 101 of the assembly 100. The second via 119 provides communication between the second interconnect 111 and the light-facing surface 101 of the assembly 100. A via is preferably, but need not be, provided for each interconnect layer.

In various embodiments, a via can comprise an optional electrically conductive fill. In FIG. 1, a first conductive fill 121 fills the first via 117, and a second conductive fill 123 fills the second via 119. Preferably, the electrically conductive fill comprises a metal. Examples of suitable metals include Al, Cu, and Au. However, other conductive metals, conductive non-metals, and combinations thereof are also suitable for use.

A dielectric material optionally can be disposed on the walls of one or more of the vias. In FIG. 1, a first dielectric 125 is disposed on the walls of the first via 117, and a second dielectric 127 is disposed on the walls of the second via 119. A dielectric material advantageously can insulate an electrically conductive fill from the subcells. Preferably, the dielectric material comprises SiO$_2$. However, various low-K and high-K non-SiO$_2$ dielectrics are also suitable for use herein.

The assembly 100 can optionally be configured with a front contact 129. The front contact 129 is configured to collect electrons from the assembly 100 through the top subcell 113. As explained above, the top subcell 113 is exposed to a source of electromagnetic radiation, such as sunlight. Photons travel through the top subcell 113 and toward the lower cells, namely, middle subcell 109 and bottom subcell 105. When the energy of an incident photon is greater than or equal to a subcell's characteristic band gap, the photon is absorbed by the subcell to create an electron-hole pair. The freed electron travels toward the front contact 129, which is configured to remove the electrons for use in an external circuit. Suitable front contacts are known in the art and comprise a conductive material, such as a metal. A variety of metals can be used, such as metals comprising Al, Au, Ag, Cu, and Zn. A front contact can further comprise a semiconductor material such as GaAs or the like and/or an anti-reflective coating layer. The front contact 129 can be configured in a comb or grid pattern on the light-facing surface 101 of the top subcell 113, as described in more detail below.

In certain embodiments, an assembly can comprise additional layers, which are not shown in FIG. 1. For example, the light-facing surface 103 of the top subcell 113 can be treated with an anti-reflective coating layer, a passivation layer, and/or other treatments to improve assembly performance.

A variety of manufacturing techniques are suitable for constructing an assembly 100 for a multi-junction PV cell, as shown in FIG. 1. For example, the subcells and interconnect layers can be deposited using suitable deposition techniques known in the art. Vias can be opened through the subcells and interconnect layers using a variety of suitable semiconductor manufacturing techniques. For example, to form second via 119 to second interconnect layer 111, a negative photoresist can be spun over top subcell 113. The photoresist can be exposed to light, thereby patterning circles in the photoresist. The photoresist can be subsequently developed to remove the exposed circles, forming holes in the photoresist. A suitable selective wet or dry etch can be used to remove the top subcell 113 material below the holes. For example, a reactive ion etch that is selective to the top subcell 113 material and that does not substantially react with second interconnect layer 111 can be used to form second via 119 to the second interconnect layer 111. Suitable etch stops as known in the art can also be used to protect the interconnect layer as needed. Second dielectric layer 127 (described above) can be subsequently deposited into the resulting via using suitable techniques such as atomic layer deposition, sputtering, vapor deposition, and the like. Electrodeposition or electroless metallization processes can be used to fill second via 119 to form second conductive fill 123. The remaining photoresist can be removed by a suitable clean process.

Figure 3:
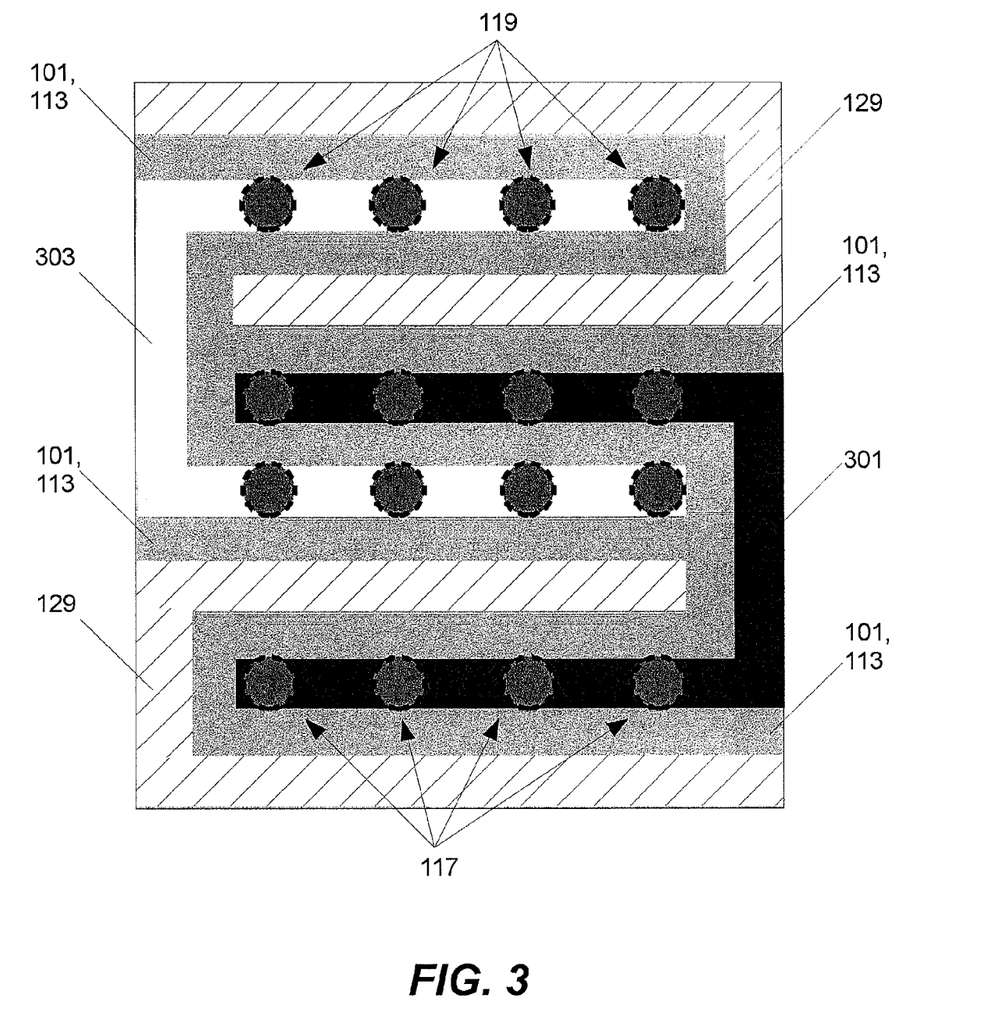
FIG. 3 is a schematic top-down representation of an example multi-junction PV cell.

Reference is next made to FIG. 3, which illustrates a schematic top-down representation of an example multi-junction PV cell 300. In general, the PV cell shown in FIG. 3 comprises the assembly of FIG. 1 as described above, and also a front contact 129 to the top subcell 113, a back contact (not shown) to the substrate (not shown), and conductive connectors 301, 303 configured to connect with the vias.

A back contact (not shown) is configured to provide an electrical connection to the substrate (not shown). As explained above, photons travel through the top subcell 113 and toward the lower cells. When the energy of an incident photon is greater than or equal to a subcell's characteristic band gap, the photon is absorbed by the subcell to create an electron-hole pair. The freed electrons travel toward the front contact 129, while the electron holes travel toward the back contact (not shown), which can contribute to a current flow to a load outside the PV cell. Suitable back contacts are known in the art and can comprise a conductive material, such as a metal. A variety of metals can be used, such as metals comprising Al, Ag, Au, Cu, and Mo. The back contact can be configured as a solid metal sheet or film disposed on the bottom surface of the substrate. However, other configurations for the back contact 129 are suitable.

The operation and structure of the front contact 129 was explained above in conjunction with FIG. 1. Because the front contact 129 is disposed on the light-facing surface 101 of the top subcell 113, the front contact 129 can block incoming sunlight from entering the PV cell 300. Configuring the front contact 129 in a comb or grid formation (as shown in FIG. 3) can advantageously provide improved PV cell performance. The comb or grid formation can provide a sufficient surface area for the front contact 129 to facilitate collecting of a large number of electrons. At the same time, the formation limits the surface area of the top subcell 113 that is blocked from incoming sunlight. While a comb or grid formation can provide desirable PV cell performance, other configurations for the front contact 129 are also suitable.

As shown in FIG. 3, a plurality of vias can be provided between various interconnect layers and an outer surface of a PV cell. As explained with reference to FIG. 1, first via 117 provides communication between the first interconnect 107 and the light-facing surface 101 of the assembly 100. Referring now to FIG. 3, a plurality of first via 117 can be used to provide communication from the light-facing surface 101 to the first interconnect layer (not shown). Likewise, a plurality of second via 119 can be used to provide communication from the light-facing surface 101 to the second interconnect layer (not shown). In certain embodiments, however, a single via can be used to provide communication to an interconnect layer.

A conductive connector, as used herein, is a conductive structure configured to electrically connect to an electrically conductive fill in at least one via. In the example of FIG. 3, first conductive fills (not shown) in the plurality of first via 117 are electrically connected by first conductive connector 301. Likewise, second conductive fills (not shown) in the plurality of second via 119 are electrically connected by second conductive structure 303. Suitable conductive connectors are similar to those described above with regard to front contact 129. Preferably, a conductive connector comprises at least one conductive metal, such as Al, Au, Ag, Cu, Zn, etc. Other conductive metals and non-metals are also suitable for use. As explained above with reference to front contact 129, the interconnect structures advantageously can be configured in a comb or grid pattern on the light-facing surface 101 of the top subcell 113, as shown in FIG. 3.

Figure 4:
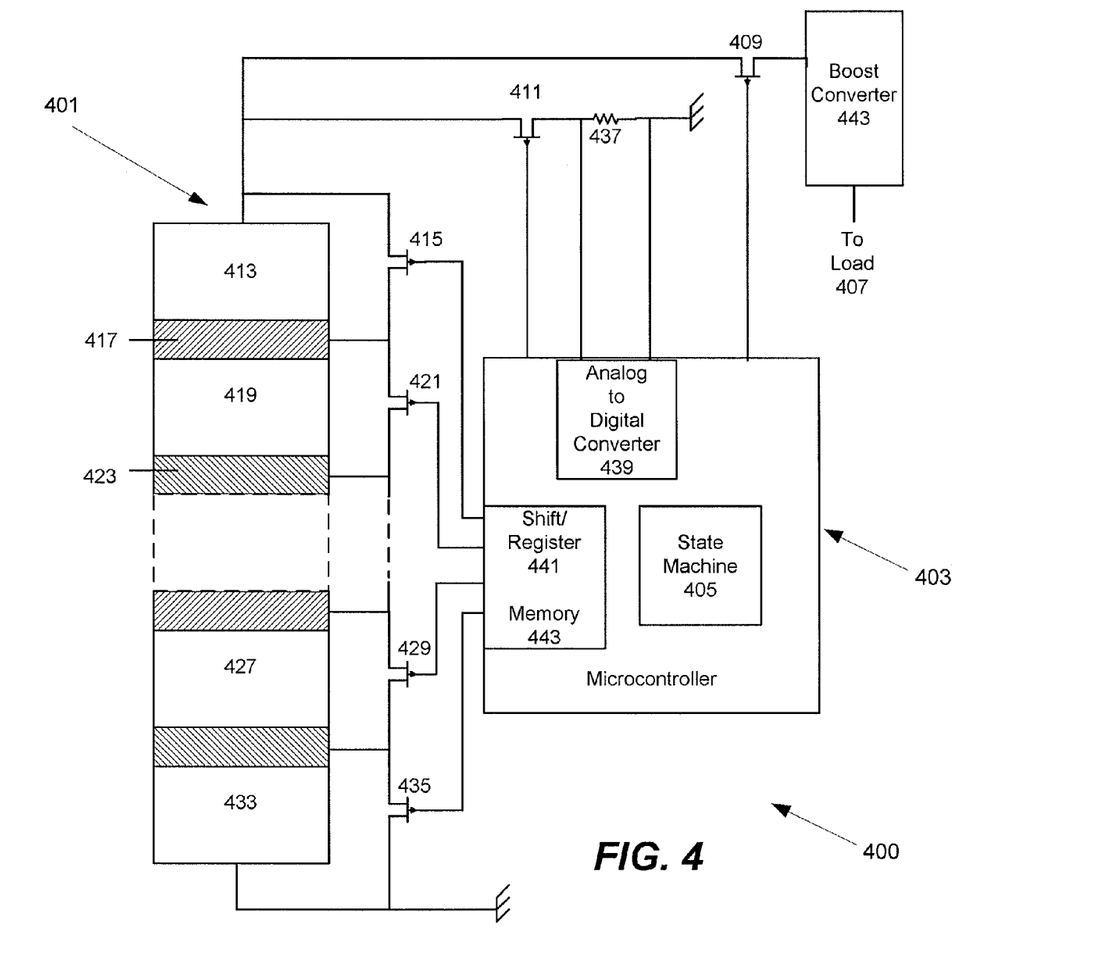
FIG. 4 is a schematic representation of an example circuit comprising a multi-junction PV cell.

Reference is now made to FIG. 4, which illustrates an example circuit 400. The circuit comprises a multi-junction PV cell 401 and a microcontroller 403 comprising a state machine 405. The state machine 405 can be configured for transitioning the circuit between an operational mode and a test mode. During the operational mode, the PV cell 400 energizes a load 407. During the test mode, the PV cell 401 is tested for weak subcells and certain subcells are shorted as needed to improve the PV cell 401 output current or voltage.

When the circuit functions in operational mode, PV operational switch 409 is closed and PV testing switch 411 switch is open. As used herein, a switch refers to an electromechanical or semiconductor switch configured to make or break an electric circuit, such as a switching transistor or other solid state switch. In operational mode, the multi-junction PV cell 401 generates an output current for energizing a load 407, such as a maximum power-point tracker (MPPT) used in conjunction with a battery or powering a mobile communication device, as described below. The load 407 could also be, for example, a cellular phone battery without a MPPT or a solar farm. In some embodiments, the circuit functions in operational mode for a predetermined time period T2.

After time period T2 elapses, state machine 405 generates instructions configured to transition the circuit from operational mode to test mode. When the circuit functions in test mode, PV testing switch 411 is closed and PV operational switch 409 is opened, thus disconnecting the load 407. The microcontroller can subsequently execute a testing sequence configured to test each subcell for current or voltage output.

In some embodiments, the testing sequence begins with all subcells shorted except for top subcell 413. In the example embodiment of FIG. 4, first cell switch 415 is opened and second cell switch 421, N−1th cell switch 429, and Nth cell switch 435 are closed. The lower layers (e.g., second subcell 419, N−1th subcell 427, and Nth subcell 433) are consequently short-circuited, and the first interconnect layer 417 is effectively electrically connected to the back contact. Preferably, the cell switches are field effect transistors (FETs), such as positive channel field effect transistors (PFETs), which can desirably be used for to test for weak junctions and also short certain subcells as described in more detail below.

The current output generated by the top subcell 413 is measured. For example, the microcontroller 403 can sample the resistor's 437 voltage using an analog-to-digital converter 439, which indicates the current generated by the top subcell 413 according to the formula $$i = \frac{V}{R}.$$

The microcontroller can store the resulting current value in memory.

The testing sequence then repeats the above-described process for the second subcell 419 in the PV cell 401. In the example embodiment of FIG. 4, the first cell switch 415 is closed (short circuiting the top subcell 413) and the second cell switch 421 is opened. N−1th cell switch 429 and Nth cell switch 435 remain closed, short circuiting the lower layers (e.g., N−1th subcell 427 and Nth subcell 433). Thus, first interconnect 417 is effectively electrically connected to the front contact, while second interconnect 423 is effectively electrically connected to the back contact. The current output generated by the next cell is measured, as described above. The testing sequence proceeds by sequentially unshorting each subcell independently, with all other subcells shorted.

To accomplish the sequential unshorting and shorting, the cell switches can be desirably used in conjunction with a shift/register 441 and memory 443. Of course, other techniques are also suitable. The shift/register 441 can comprise an array of bits. In some embodiments, each bit in the shift/register 441 can drive one of the transistors or other cell switches. During the testing mode, for example, one bit can be set to logic zero by supplying no voltage to the bit. A logic zero setting can correspond to a closed (or shorted) position for an associated PFET (e.g., first cell switch 415). Concurrently, the other bits are set to logic one, for example, by supplying a discrete voltage (e.g., 1 V, 5 V, etc.) to the bits. A logic one setting can correspond to an open (or unshorted) position for the associated PFET (e.g., second cell switch 421, N−1th cell switch 429, and Nth cell switch 435). For simplicity, the above-described register memory configuration may be denoted by the following short-hand representation: [0,1,1,1, . . . ].

After the current or voltage for the desired subcell is sampled, the current or voltage can be stored in memory 443, and a binary clock shifts the bits in the shift/register 441. Consequently, using the above short-hand representation, the shift/register 441 after one shift may be denoted as [1,0,1, 1, . . . ], after two shifts as [1,1,0,1, . . . ], after three shifts as [1,1,1,0, . . . ], and so forth. This shifting process can proceed to sample the desired number of subcells.

In the example of FIG. 4, the weak subcells are identified in N steps. However, alternative embodiments comprising more or fewer steps can be used. Moreover, the testing process need not proceed in the series fashion described in the above example. Cells and combinations of cells can be tested in any practicable sequence.

After measuring the current or voltage generated by each subcell, the microcontroller subsequently loads the shift/register 441 (or other suitable component) to short the identified weak subcell or subcells (e.g., [0,1,0,1, . . . ]). As an example, the cell switches corresponding to the weak subcells can be closed, while the cell switches corresponding to the strong subcells can be opened.

A wide variety of thresholds are suitable for deciding whether to short a layer. In some embodiments, the threshold can be based on the total output current of the PV cell ($i_{PV}$). As an example, prior to shorting any subcells, $i_{PV}$ can be evaluated. As discussed above, the output current will be limited by the weakest subcell. Consequently, the microcontroller can short any subcells having an output current ($i_{Si}$) equal to $i_{PV}$. This threshold may also be based on a difference from $i_{PV}$ ($\Delta$), e.g., do not short if $i_{Si} \geq i_{PV} + \Delta$, or based on a factor or ratio (F) from $i_{PV}$, e.g., do not short if $i_{Si} \geq F i_{PV}$. The threshold can also be based on the previous output current of the PV cell, regardless of whether layers have been shorted. For example, if the current of a subcell is less than the previous output current of the PV cell, the subcell can be shorted. In some embodiments, the microcontroller can incorporate voltage loss in the decision whether to short a subcell. For instance, if the voltage losses from shorting a subcell are unacceptably high to justify the gain in current, then the cell will not be shorted.

The test period ends at a time period designated here as T1. T1 need not be a predetermined time period and can be equal to the time needed to test each subcell and short the subcells determined to be weak.

After time period T1 elapses, state machine 405 generates instructions configured to transition the circuit from test mode to operational mode by opening testing switch 411 and closing operational switch 413. Because the current-limiting weak subcells have been shorted out, the PV cell's 401 output current is consequently increased. Shorting of subcells can cause a reduction in the output voltage, which can be recovered by using an optional boost synchronous converter 443 or other suitable voltage-increasing mechanism.

Figure 5:
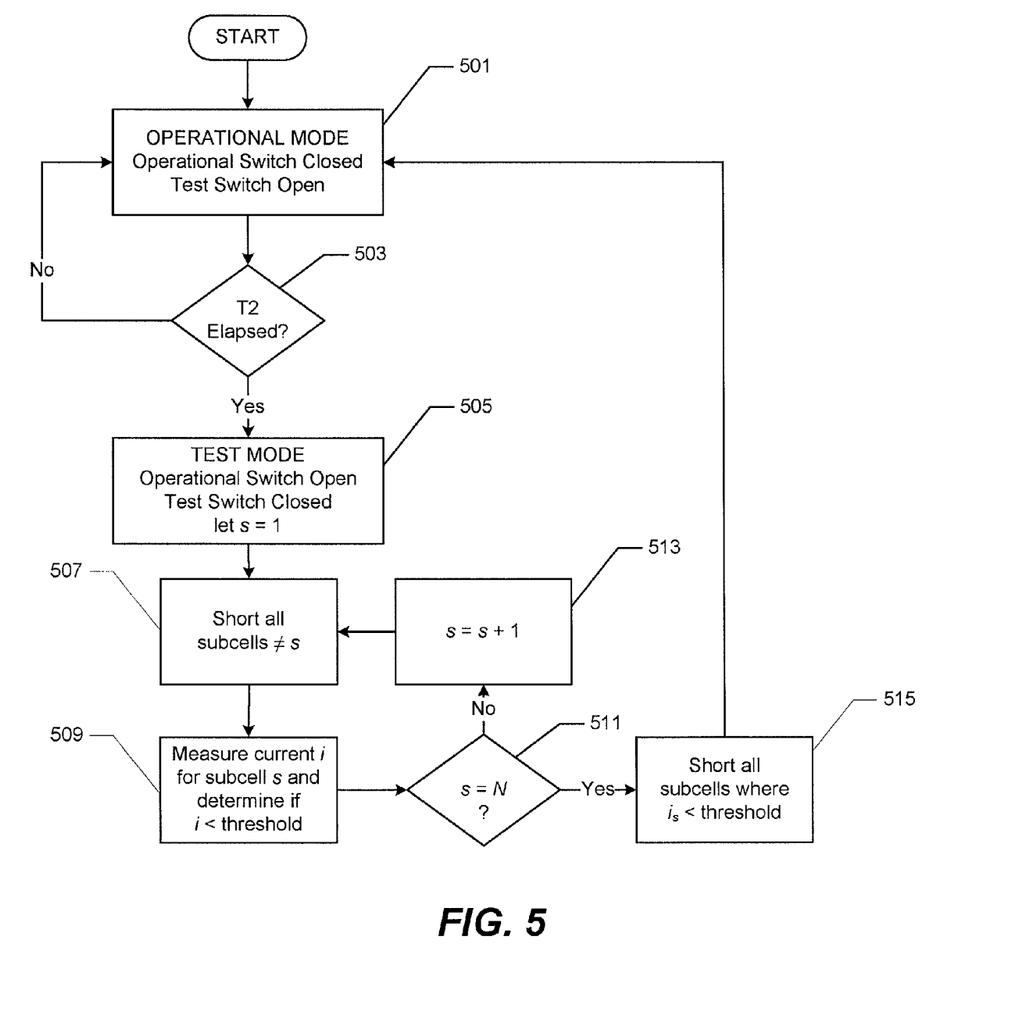
FIG. 5 is a flow chart showing an example method for current loss compensation in a multi-junction PV cell.

The above-described method for compensating for current loss in a multi-junction PV cell is shown as a flowchart in FIG. 5. As shown in Block 501, for time period T2, the circuit operates in operational mode, in which the operational switch is closed and the test switch is open. A timer or other suitable decision function checks whether T2 has elapsed, as shown in Block 503. If time period T2 has not yet elapsed, the circuit continues operating in operational mode. If time period T2 has elapsed, the circuit transitions to test mode by opening the operational switch and closing the test switch, as shown in Block 505. A counter variable s is initialized by setting s=1.

As shown in Block 507, the test mode begins with all subcells shorted except subcell 1, for example, the top subcell. In Block 509, the current output generated by subcell 1 is measured and recorded. A decision processor checks whether the counter variable s is equal to the total number of subcells (N), as shown in Block 511. This process determines whether all subcells have been shorted and measured. If the counter variable s is not equal to N, then the counter variable is incremented by 1, and the above-described method of shorting and measuring is repeated for subcell s=s+1. However, if counter variable s is equal to the total number of subcells N, then all weak subcells are shorted and the circuit transitions from test mode to operational mode.

The operational period T2 is preferably much longer than the test period T1. In some embodiments, the operational time period T2 (on the order of seconds, minutes, or hours) can be selected depending upon the PV cell's 401 intended environment. For example, if the PV cell 401 is intended to operate in a cellular phone, the lighting conditions may change rapidly as the user walks in and out of buildings or moves the phone's position. Consequently, a shorter operational period T2 and more frequent testing period T1 may be desirable. As another example, if the PV cell is intended to operate in a solar array in the southwestern United States, T2 may be configured to operate with a longer operational mode, on the order of several hours. In some embodiments, T2 can increase or decrease over the course of a day (e.g., longer T2 between the hours of 10 a.m. and 2 p.m. and shorter T2 during the remaining daylight hours). A computational processor (not shown) can optionally adjust T2 based upon the prior sampling results. For example, T2 can be increased if the sampling results have been substantially stable over a certain number of (e.g., 3 or 4) T1 testing periods. Conversely, T2 can be decreased if prior sampling results indicate variable lighting conditions.

There is a loss of efficiency due to the surface area of the PV cells used for metal vias and due to the T1 sampling period, where no current is passed to the load. However, if one junction of a multi-junction cell loses its wavelength, then PV cell efficiency drops dramatically, as that weak junction determines the overall current. It has been found that the efficiency loss due to surface area reduction and T1 testing is small compared to the efficiency loss for failing to compensate for variable lighting conditions.

The disclosed embodiments can improve the performance of an MPPT connected to a PV circuit. Wavelength fluctuations in a non-compensated PV cell cause extra work for a MPPT. An MPPT is a high efficiency DC to DC converter that can be used as an electrical load in PV cells. A PV cell has an exponential relationship between current and voltage, and the maximum power point (MPP) occurs where the resistance $$\frac{V}{i}$$

is equal to the negative of the differential resistance, $$-\frac{dV}{di}.$$

An MPPT uses a control circuit or logic to search for this point and thus to allow the converter circuit to extract the maximum power available from a cell. The loss of one subcell in a multi-junction PV cell causes a major loss of current and some loss of voltage, causing the MPP to fluctuate. As explained above, the embodiments disclosed herein can improve the current reduction problem by shorting out current-limiting subcells and compensate for the voltage drop by using a boost synchronous converter. The stabilized input to the MPPT consequently reduces the number of local maxima the MPPT system would have to deal with otherwise.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions, and changes in the form of the methods and systems described herein may be made without departing from the spirit of the inventions. The accompanying claims and their equivalents are intended to cover such forms or modifications as would fall within the scope and spirit of the inventions.

What is claimed is:

1. A multi junction photovoltaic cell comprising:
a plurality of subcells comprising a first subcell having a surface, a second subcell, and one or more intermediate subcells, wherein the one or more intermediate subcells are configured in layers between the first subcell and the second subcell;
an first terminal in communication with the first subcell and a second terminal in communication with the second subcell, wherein the terminals are configured to receive an electrical load;
an interconnect layer disposed between each of the subcells in the plurality of subcells; and
for each of the interconnect layers,
an electrically conductive via extending between the surface of the first subcell and the interconnect layer, wherein the via between the surface and the interconnect layer is different for each interconnect layer, and
a conductive connector in electrical communication with the via and configured to provide electrical communication between the interconnect layer and a microprocessor to allow for the measurement of current or voltage from the interconnect layer.

2. The cell of claim 1, wherein the conductive connector comprises a metal.

3. The cell of claim 1, comprising one intermediate subcell.

4. The cell of claim 1, comprising four intermediate subcells.

5. The cell of claim 1, further comprising for each conductive connector, a solid state switch in electrical communication with the conductive connector, wherein the conductive connector is configured to bypass a subcell adjacent the interconnect layer in communication with the conductive connector based upon the measured current or voltage from the interconnect layer.

6. The cell of claim 1, comprising for each interconnect layer, a plurality of vias, wherein the conductive connector for each of the interconnect layers is configured in a comb-shaped pattern, and the plurality of vias are spaced along the conductive connector.

7. The cell of claim 1, comprising for each interconnect layer, a plurality of vias, wherein the plurality of vias are substantially centered along the conductive connector.

* * * * *